(12) United States Patent
Odate

(10) Patent No.: US 9,665,060 B2
(45) Date of Patent: May 30, 2017

(54) POWER SUPPLY APPARATUS, IMAGE FORMING APPARATUS, AND NOISE FILTER

(71) Applicant: CANON KABUSHIKI KAISHA, Tokyo (JP)

(72) Inventor: Takashi Odate, Tachikawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/160,827

(22) Filed: May 20, 2016

(65) Prior Publication Data

US 2016/0359417 A1 Dec. 8, 2016

(30) Foreign Application Priority Data

Jun. 2, 2015 (JP) ................. 2015-112301

(51) Int. Cl.
| | |
|---|---|
| *G03G 15/00* | (2006.01) |
| *H02M 1/12* | (2006.01) |
| *H02M 1/42* | (2007.01) |
| *H02M 7/00* | (2006.01) |
| *H05K 1/00* | (2006.01) |

(52) U.S. Cl.
CPC ............ *G03G 15/80* (2013.01); *H02M 1/126* (2013.01); *H02M 1/4258* (2013.01); *H02M 7/003* (2013.01); *H05K 1/00* (2013.01)

(58) Field of Classification Search
CPC .... G03G 15/80; H02M 1/126; H02M 1/4258; H02M 7/003; H05K 1/00
See application file for complete search history.

(56) References Cited

U.S. PATENT DOCUMENTS

| | | | | |
|---|---|---|---|---|
| 4,943,886 | A | * 7/1990 | Quazi | H05B 41/2851 307/326 |
| 5,382,893 | A | * 1/1995 | Dehnel | H02J 7/008 307/66 |
| 5,841,202 | A | * 11/1998 | Noguchi | H04B 15/04 174/363 |

FOREIGN PATENT DOCUMENTS

JP          H05-2008 B2    1/1993

* cited by examiner

*Primary Examiner* — G. M. Hyder
(74) *Attorney, Agent, or Firm* — Fitzpatrick, Cella, Harper & Scinto

(57) ABSTRACT

The noise filter includes a first capacitor that is mounted on a substrate, and includes one end connected to a live side of an AC line of an AC voltage supplied from an AC power supply, a second capacitor including one end connected to a neutral side of the AC line, a first ground pattern to which another end of the first capacitor is connected, and a second ground pattern to which another end of the second capacitor is connected. The first ground pattern and the second ground pattern are not connected electrically on the substrate.

14 Claims, 7 Drawing Sheets

POWER SUPPLY APPARATUS, IMAGE FORMING APPARATUS, AND NOISE FILTER

BACKGROUND OF THE INVENTION

Field of the Invention

The present invention relates to a power supply apparatus, an image forming apparatus, and a noise filter, and more particularly, to a power supply apparatus including capacitors each being connected from an AC line to a ground.

Description of the Related Art

A power supply apparatus using a commercial AC power supply as an input thereof hitherto has a filter as a device configured to suppress switching noise of an AC/DC converter or the like or terminal noise due to reverse recovery of a diode bridge. As the filter, a noise filter including a common mode choke coil, an X capacitor (across-the-line capacitor), and a Y capacitor (line bypass capacitor) is generally used. For example, a related-art power supply apparatus illustrated in FIG. 7A and FIG. 7B includes a first noise filter 210 between a commercial AC power supply 100 and a diode bridge 201 serving as a rectifying device. Further, the power supply apparatus illustrated in FIG. 7A and FIG. 7B includes a second noise filter 220 between the diode bridge 201 and an isolation transformer 203 (see, for example, Japanese Patent Application Laid-Open No. H05-2008). Terminal noise in a power supply apparatus 110 using the commercial AC power supply 100 as an input thereof includes noise caused when a field-effect transistor (hereinafter referred to as FET) 204 operates and noise caused due to reverse recovery of the diode bridge 201. Those kinds of noise are suppressed by the first noise filter 210 and the second noise filter 220. In general, Y capacitors 213, 214, 223, and 224 forming the noise filters are arranged on respective AC lines, and are connected to a frame ground 122 via a ground terminal 123 or the like formed on a substrate 121. The frame ground 122 is connected to a ground of the commercial AC power supply 100. Detailed description of FIG. 7A and FIG. 7B is made below.

However, as illustrated in FIG. 7B, there is, for example, a case in which ground patterns 127 of the Y capacitors 213 and 214 are connected to each other on the substrate 121 and the ground patterns 127 have a common impedance 128 before reaching the ground terminal 123. In FIG. 7B, a pattern from a node A between the ground patterns 127 of the Y capacitors 213 and 214 to the ground terminal 123 is the common impedance 128 of the Y capacitors 213 and 214.

A potential at the point A of the impedance 128 changes depending on noise suppressed or absorbed by one of the Y capacitors 213 and 214. Specifically, for example, noise suppressed or absorbed by the Y capacitor 213 changes the potential at the point A, and thus, even if noise is not suppressed or absorbed by the Y capacitor 214 at that time, the potential at the point A that is a ground potential for the Y capacitor 214 changes. Therefore, noise is also caused in the Y capacitor 214, and the Y capacitor 214 operates so that the potential of the AC line is constant in accordance with the potential at the point A. As a result, the potential of the AC line is fluctuated to increase the terminal noise. In other words, the effect of suppressing noise by the Y capacitors 213 and 214 cannot be fully exerted.

SUMMARY OF THE INVENTION

In order to solve the problem described above, one embodiment of the present invention has the following configuration.

That is, there is provided a power supply apparatus, including:

a first capacitor including at least one capacitor, one end of the first capacitor being connected to a live side of an AC line of an AC voltage supplied from an AC power supply;

a second capacitor including at least one capacitor, one end of the second capacitor being connected to a neutral side of the AC line;

at least one first ground pattern to which another end of the first capacitor is connected;

at least one second ground pattern to which another end of the second capacitor is connected; and a substrate on which the first capacitor and the second capacitor are mounted, and the at least one first ground pattern and the at least one second ground pattern are formed, in which the at least one first ground pattern and the at least one second ground pattern are prevented from being connected electrically on the substrate.

According to the present invention, the effect of suppressing noise by capacitors arranged as a noise filter can be fully exerted.

Further features of the present invention will become apparent from the following description of exemplary embodiments with reference to the attached drawings.

DESCRIPTION OF THE EMBODIMENTS

Figure 1:
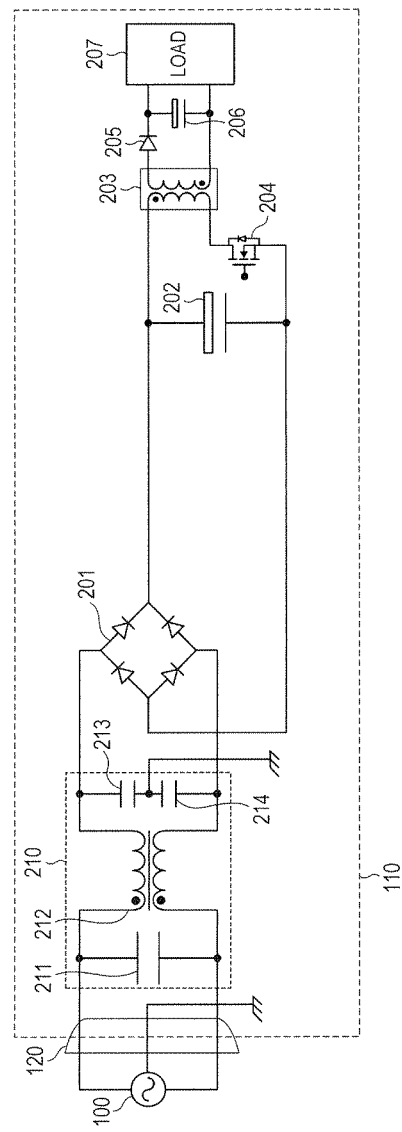
FIG. 1 is a circuit diagram of a power supply apparatus according to a first embodiment of the present invention.

A specific configuration of the present invention is described based on embodiments with reference to the accompanying drawings. Note that, the embodiments described below are merely examples and should not be interpreted to limit the technical scope of the present invention.

[Circuit Configuration of Power Supply Apparatus]

A circuit configuration of the related-art power supply apparatus 110 is described with reference to FIG. 7A for comparison with the embodiments to be described below. An inlet 120 is formed in the power supply apparatus 110, and an AC voltage of the commercial AC power supply 100 is supplied to the power supply apparatus 110 via the inlet 120. The AC voltage of the commercial AC power supply 100 supplied to the power supply apparatus 110 is rectified from a sinusoidal waveform into a pulsating waveform, in which waveform on the negative side is folded back to the positive side, by the diode bridge 201 via the first noise filter 210. The output of the pulsating waveform rectified by the diode bridge 201 is smoothed by a primary smoothing capacitor 202 via the second noise filter 220 into a DC voltage having a value that is substantially equal to a peak value of the sinusoidal waveform. The DC voltage smoothed by the primary smoothing capacitor 202 is input from a positive terminal thereof to the isolation transformer 203, and further, fed back to a negative terminal thereof via the FET 204 serving as a switching element. A secondary-side rectifier circuit including a rectifier diode 205 and a smoothing capacitor 206 exists on the secondary side of the isolation transformer 203. The voltage is smoothed into a predetermined voltage by the secondary-side rectifier circuit to be output to a load 207 that is inside or outside the power supply apparatus 110.

In this case, the first noise filter 210 includes an across-the-line capacitor (hereinafter referred to as X capacitor) 211, a common mode choke coil 212, and line bypass capacitors (hereinafter referred to as Y capacitors) 213 and 214. The Y capacitor 213 is connected to the ground pattern 127 serving as a first ground pattern group, and forms a first capacitor group including at least one capacitor. Further, the Y capacitor 214 is connected to the ground pattern 127 serving as a second ground pattern group, and forms a second capacitor group including at least one capacitor. In FIG. 7B, the first ground pattern group and the second ground pattern group are one ground pattern 127.

The Y capacitor 213 is, for example, a ceramic capacitor, and one end thereof is connected to a live side of the AC line, while another end thereof is connected to a ground. One end of the Y capacitor 214 is connected to a neutral side of the AC line, while another end thereof is connected to a ground. The first noise filter 210 is arranged for the purpose of suppressing switching noise caused when the FET 204 of the power supply apparatus 110 operates and terminal noise caused due to reverse recovery of the diode bridge 201. The second noise filter 220 includes an X capacitor 221, a common mode choke coil 222, and the Y capacitors 223 and 224. One end of the Y capacitor 223 is connected to a positive terminal line of the primary smoothing capacitor 202, while another end thereof is connected to a ground. One end of the Y capacitor 224 is connected to a negative terminal line of the primary smoothing capacitor 202, while another end thereof is connected to a ground. The second noise filter 220 is arranged for the purpose of suppressing switching noise caused when the FET 204 of the power supply apparatus 110 operates. One end of each of the Y capacitors 213, 214, 223, and 224 is connected to an AC line, and another end of each thereof is connected to a ground. The Y capacitors 213, 214, 223, and 224 suppress terminal noise caused in the power supply apparatus 110. At this time, the terminal noise is bypassed to the frame ground 122 via the ground pattern 127. The frame ground 122 is a holding frame configured to fix the substrate 121 of the power supply apparatus 110, and is formed of a metal sheet. The frame ground 122 is a metal sheet, and thus, an impedance thereof is sufficiently lower than that of a wiring pattern on the substrate 121.

[Pattern of Substrate of Power Supply Apparatus]

Figure 7A:
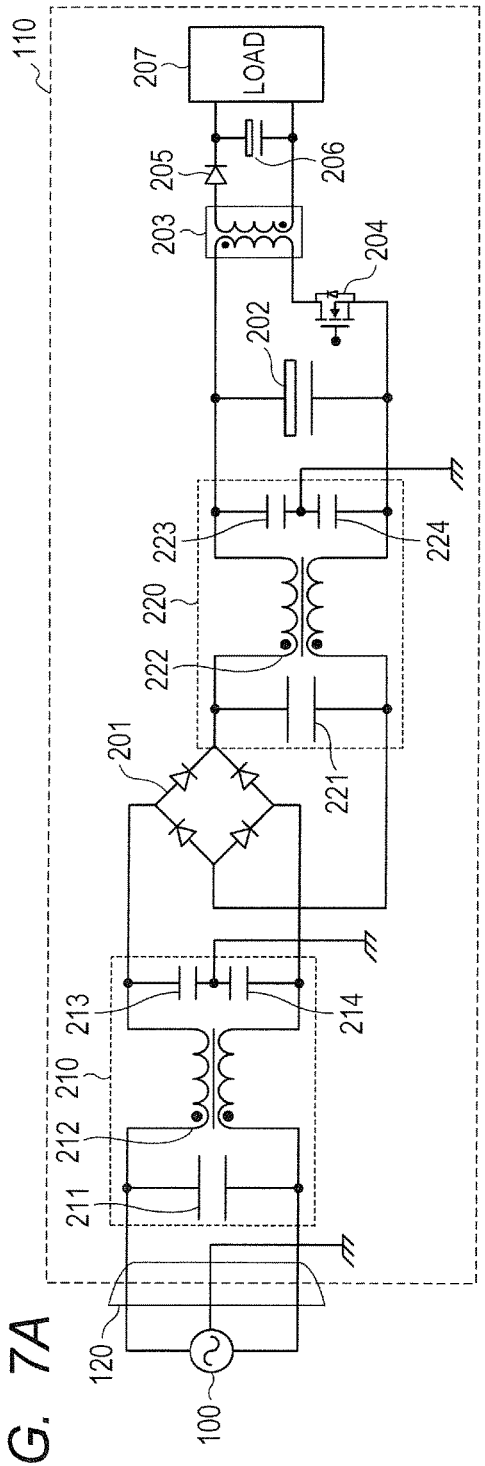
FIG. 7A is a circuit diagram of a related-art power supply apparatus.
Figure 7B:
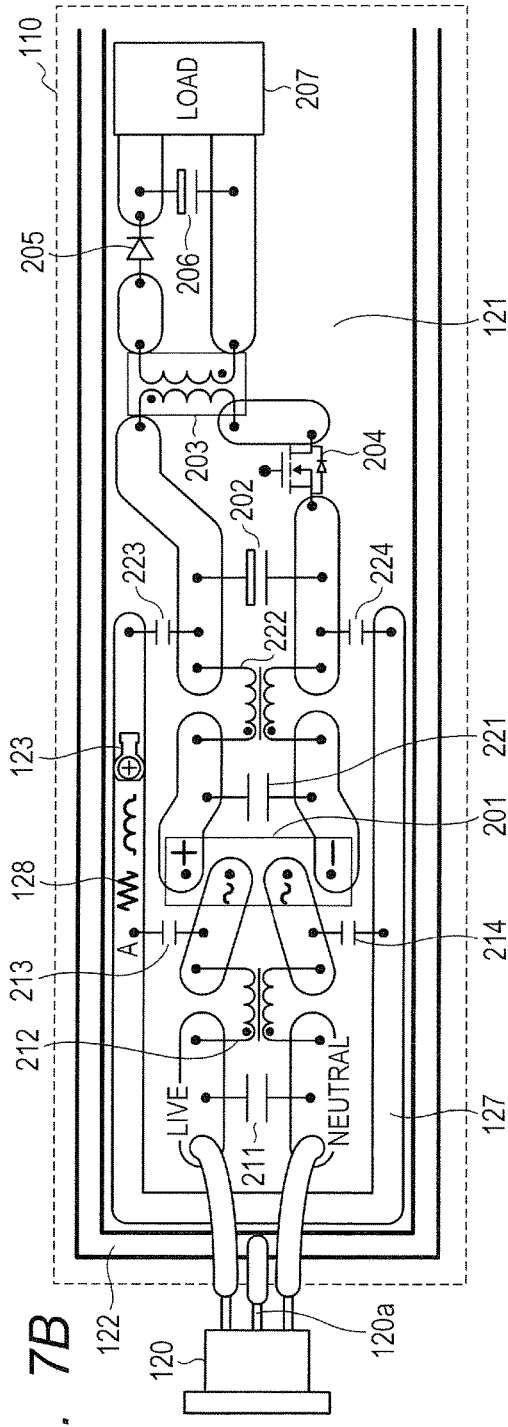
FIG. 7B is an illustration of a pattern of a substrate of the related-art power supply apparatus.

FIG. 7B is an illustration of a pattern of the substrate 121 for mounting a circuit of the power supply apparatus 110 illustrated in FIG. 7A. Portions illustrated as thick black solid lines on the substrate 121 in FIG. 7B are portions connected electrically and are, for example, a pattern of copper foil. White portions are portions insulated electrically and are, for example, a resist. One end of the Y capacitor 213 is connected to the live side of the AC line of the commercial AC power supply 100 that is input to the power supply apparatus 110 via the inlet 120, while another end thereof is connected to the ground pattern 127. The Y capacitor 213 is connected to the frame ground 122 via the ground terminal 123 serving as a first connecting member. One end of the Y capacitor 214 is connected to the neutral side of the AC line of the commercial AC power supply 100, while another end thereof is connected to the ground pattern 127. The Y capacitor 214 is also connected to the frame ground 122 via the ground terminal 123.

The Y capacitor 213 connected to the live side serving as a first AC line and the Y capacitor 214 connected to the neutral side serving as a second AC line are connected to the common ground pattern 127. The ground terminal 123 is formed in the ground pattern 127. The ground terminal 123 is connected to the frame ground 122. The frame ground 122 is connected to the ground of the commercial AC power supply 100 via a ground 120a of the inlet 120.

[Circuit Configuration of Power Supply Apparatus]

A circuit configuration of a power supply apparatus 110 according to a first embodiment of the present invention is described with reference to FIG. 1. Note that, like reference numerals are used to designate like components described with reference to FIG. 7A, and description thereof is omitted. The power supply apparatus 110 of this embodiment includes only a first noise filter 210. The first noise filter 210 includes, similarly to the first noise filter 210 illustrated in FIG. 7A, an X capacitor 211, a common mode choke coil 212, and Y capacitors 213 and 214. The Y capacitor 213 is connected to a ground pattern 127 serving as a first ground pattern group, and forms a first capacitor group including at least one capacitor. Further, the Y capacitor 214 is connected to a ground pattern 131 serving as a second ground pattern group, and forms a second capacitor group including at least one capacitor. In this embodiment, the ground pattern 127 serving as the first ground pattern group and the ground pattern 131 serving as the second ground pattern group are not connected electrically on a substrate 121.

The first noise filter 210 is arranged for the purpose of suppressing switching noise caused when an FET 204 of the power supply apparatus 110 operates and terminal noise caused due to reverse recovery of a diode bridge 201. One end of each of the Y capacitors 213 and 214 to be focused on in this embodiment is connected to an AC line, and another end of each thereof is connected to a ground. The Y capacitors 213 and 214 suppress terminal noise caused in the power supply apparatus 110. At this time, the terminal noise is bypassed to a frame ground 122 via the ground patterns 127 and 131.

The frame ground 122 is a holding frame configured to fix the substrate 121 of the power supply apparatus 110, and is formed of a metal sheet. The frame ground 122 is a metal sheet, and thus, an impedance thereof is sufficiently lower than that of a wiring pattern on the substrate 121. For example, a case is considered in which, as in this embodiment, two ground terminals 123 and 124 on the substrate 121 are connected to the frame ground 122 and the frame ground 122 is connected to a ground of the commercial AC power supply 100. In this case, noise bypassed to the frame ground 122 from the ground terminal 123 flows into the ground of the commercial AC power supply 100 via the holding frame having the sufficiently low impedance. Therefore, the noise bypassed to the frame ground 122 from the ground terminal 123 does not go around a connecting portion between the other ground terminal 124 and the frame ground 122, and vice versa.

[Pattern of Substrate of Power Supply Apparatus]

Figure 2:
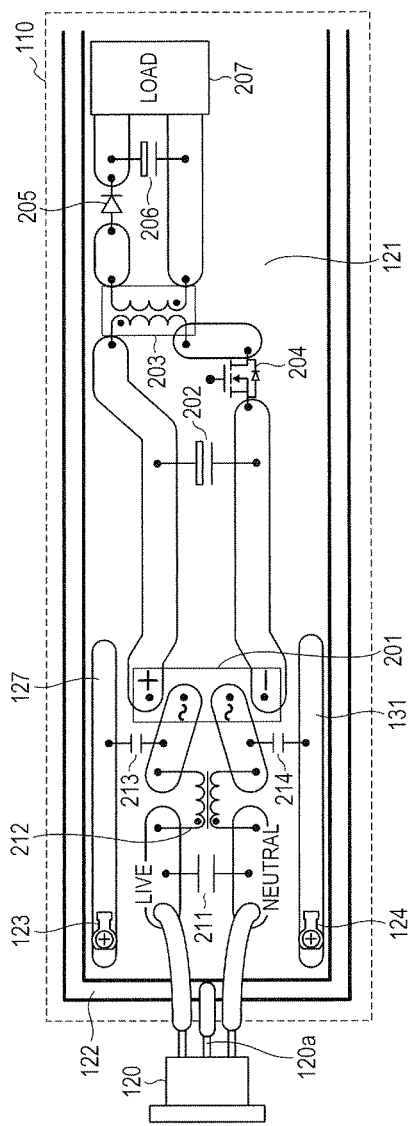
FIG. 2 is an illustration of a pattern of a substrate of the power supply apparatus according to the first embodiment.

FIG. 2 is an illustration of a pattern of the substrate according to this embodiment. Note that, like reference numerals are used to designate like components described with reference to FIG. 7B, and description thereof is omitted. One end of the Y capacitor 213 is connected to the live side of the AC line of the commercial AC power supply 100 that is input to the power supply apparatus 110 via the inlet 120, while another end thereof is connected to the ground pattern 127. The Y capacitor 213 is connected to the frame ground 122 via the ground terminal 123. One end of the Y capacitor 214 is connected to the neutral side of the AC line of the commercial AC power supply 100, while another end thereof is connected to the ground pattern 131. The Y capacitor 214 is connected to the frame ground 122 via the ground terminal 124 serving as a second connecting member.

The ground pattern 127 of the Y capacitor 213 connected to the live side serving as the first AC line and the ground pattern 131 of the Y capacitor 214 connected to the neutral side serving as the second AC line are electrically separated from each other on the substrate 121. Further, the Y capacitors 213 and 214 are connected to the frame ground 122 that is connected to the ground of the commercial AC power supply 100 via different ground terminals 123 and 124. Such a configuration eliminates a common impedance between the Y capacitor 213 connected to the first AC line and the Y capacitor 214 connected to the second AC line. Then, noise absorbed by the Y capacitor 213 is bypassed to the frame ground 122 via the ground terminal 123, and is fed back from the frame ground 122 to the ground of the commercial AC power supply 100. Further, noise absorbed by the Y capacitor 214 is bypassed to the frame ground 122 via the ground terminal 124, and is fed back from the frame ground 122 to the ground of the commercial AC power supply 100.

As described above, according to this embodiment, the Y capacitors 213 and 214 are configured to be able to bypass noise to the frame ground 122 and to the ground of the commercial AC power supply 100 without having the common impedance. This can prevent change in ground potential of the Y capacitors 213 and 214 due to suppression or absorption of noise by each other, with the result that the effect of suppressing terminal noise can be fully exerted. As described above, according to this embodiment, the effect of suppressing noise by the capacitors arranged as the noise filter can be fully exerted.

[Circuit Configuration of Power Supply Apparatus]

A power supply apparatus according to a second embodiment of the present invention is now described. This embodiment is different from the first embodiment in circuit configuration. According to this embodiment, a second noise filter 220 is connected downstream of the diode bridge 201. Therefore, the circuit diagram of the power supply apparatus 110 according to this embodiment is similar to the circuit diagram of FIG. 7A, but the illustration of a pattern of the substrate 121 is different from the illustration of the pattern in FIG. 7B. The second noise filter 220 includes an X capacitor 221, a common mode choke coil 222, and Y capacitors 223 and 224. One end of the Y capacitor 223 is connected to a positive terminal line of the primary smoothing capacitor 202, while another end thereof is connected to a ground. One end of the Y capacitor 224 is connected to a negative terminal line of the primary smoothing capacitor 202, while another end thereof is connected to a ground. In this embodiment, the Y capacitor 223 is connected to the ground pattern 127 (see FIG. 3 to be referred to in the description below) serving as a third ground pattern group, and forms a third capacitor group including at least one capacitor. Further, according to this embodiment, the Y capacitor 224 is connected to the ground pattern 131 (see FIG. 3 to be referred to in the description below) serving as a fourth ground pattern group, and forms a fourth capacitor group including at least one capacitor. Note that, like reference numerals are used to designate like components described in the first embodiment or with reference to FIG. 7A, and description thereof is omitted.

[Pattern of Substrate of Power Supply Apparatus]

Figure 3:
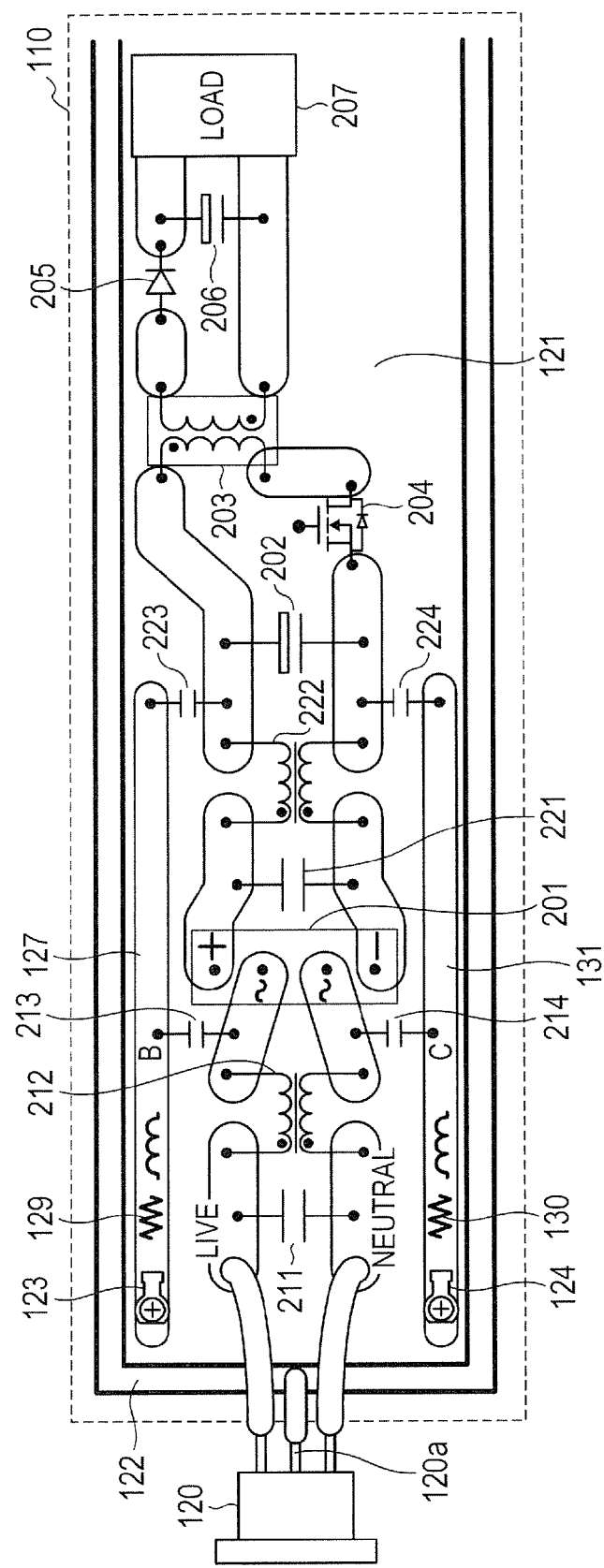
FIG. 3 is an illustration of a pattern of a substrate of a power supply apparatus according to a second embodiment of the present invention.

FIG. 3 is an illustration of a pattern of a substrate according to this embodiment. The Y capacitor 213 connected to the live side of the commercial AC power supply 100 and the Y capacitor 223 connected to the positive terminal line of the primary smoothing capacitor 202 are connected to the ground pattern 127 on the substrate 121. The Y capacitors 213 and 223 are connected to the frame ground 122 at the ground terminal 123 via the ground pattern 127. The Y capacitor 214 connected to the neutral side of the commercial AC power supply 100 and the Y capacitor 224 connected to the negative terminal line of the primary smoothing capacitor 202 are connected to the ground pattern 131 on the substrate 121 (on the substrate). The Y capacitors 214 and 224 are connected to the frame ground 122 at the ground terminal 124 via the ground pattern 131. In this embodiment, the Y capacitor 213 and the Y capacitor 223 are connected to the ground pattern 127, and the Y capacitor 214 and the Y capacitor 224 are connected to the ground pattern 131. However, the Y capacitor 213 and the Y capacitor 224 may be connected to the ground pattern 127 and the Y capacitor 214 and the Y capacitor 223 may be connected to the ground pattern 131.

Such a pattern eliminates a common impedance between the Y capacitors 213 and 223 and the Y capacitors 214 and 224. Then, noise absorbed by the Y capacitors 213 and 223 is bypassed to the frame ground 122 via the ground terminal 123, and is fed back from the frame ground 122 to the ground of the commercial AC power supply 100. Further, noise absorbed by the Y capacitors 214 and 224 is bypassed to the frame ground 122 via the ground terminal 124, and is fed back from the frame ground 122 to the ground of the commercial AC power supply 100.

As described above, according to this embodiment, the Y capacitor 213 and the Y capacitor 223 do not have an impedance common with the Y capacitor 214 and the Y capacitor 224. Further, noise absorbed or suppressed by those capacitors can be bypassed to the frame ground 122 and to the ground of the commercial AC power supply 100. This can prevent change in ground potential of the Y capacitors 213, 214, 223, and 224 due to suppression or absorption of noise by each other, with the result that the effect of suppressing terminal noise can be fully exerted. As described above, according to this embodiment, the effect of suppressing noise by the capacitors arranged as the noise filter can be fully exerted.

[Pattern of Substrate of Power Supply Apparatus]

Figure 4:
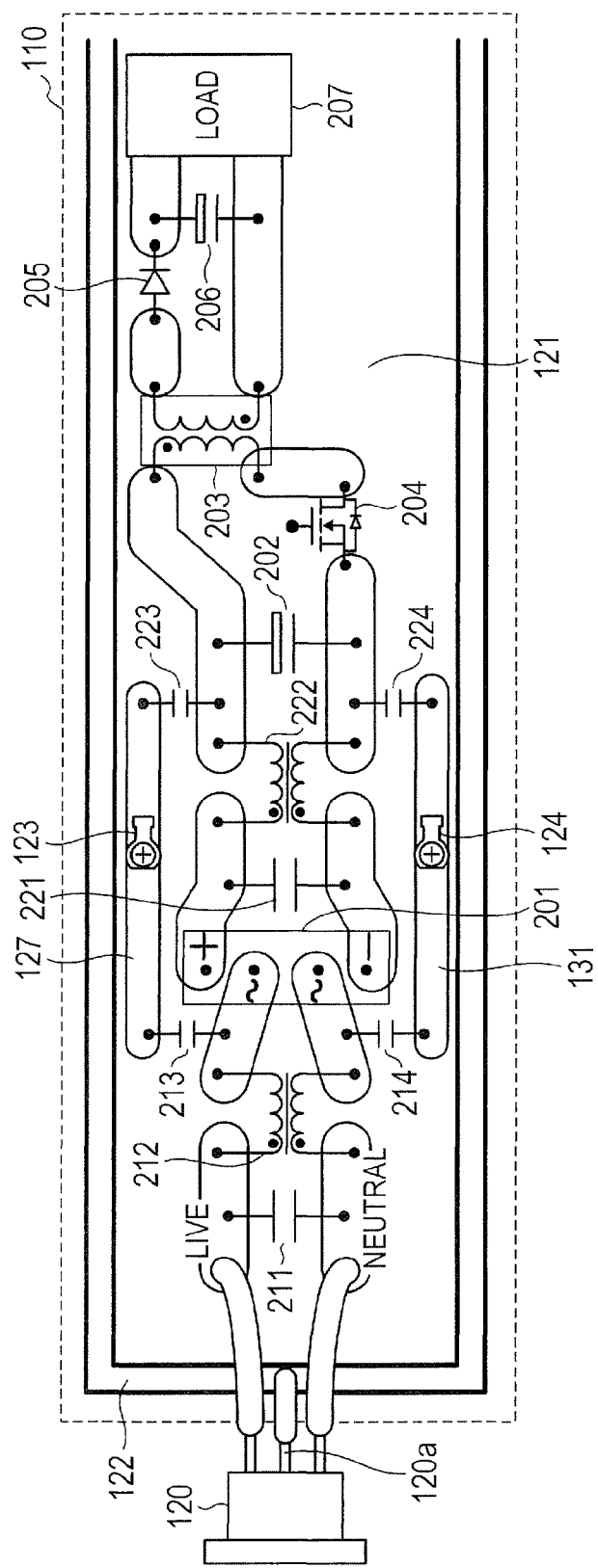
FIG. 4 is an illustration of a pattern of a substrate of a power supply apparatus according to a third embodiment of the present invention.

FIG. 4 is an illustration of a pattern of a substrate according to a third embodiment of the present invention. This embodiment is different from the second embodiment in positions at which the ground terminals 123 and 124 are arranged. Note that, like reference numerals are used to designate like components described in the second embodiment, and description thereof is omitted. In the second embodiment, the Y capacitor 213 and the Y capacitor 223 do not have an impedance common with the Y capacitor 214 and the Y capacitor 224 (see FIG. 3). Further, in the configuration illustrated in FIG. 3, noise absorbed or suppressed by the capacitors is configured to be able to be bypassed to the frame ground 122 and to the ground of the commercial AC power supply 100. Here, the Y capacitors 213 and 223 have a common impedance 129. In this case, the Y capacitors 213 and 223 can be electrically separated from the Y capacitors 214 and 224 by AC lines. However, operation of suppressing or absorbing noise of one of the Y capacitors existing on the same AC line, for example, the Y capacitor 213, may change a potential at a point B of the common impedance to affect operation of the Y capacitor 223 as another of the Y capacitors. As a result, the potential of the AC line may be fluctuated to increase the terminal noise. With regard to the Y capacitors 214 and 224, similarly, a common impedance 130 exists, and a potential at a point C may be changed.

According to this embodiment, by changing the positions of the ground terminals 123 and 124 as illustrated in FIG. 4, the problem described above can be solved. FIG. 4 is an illustration of the configuration in which the ground terminal 123 is arranged between Y capacitors connected to the same AC line, for example, between the Y capacitor 213 and the Y capacitor 223. Similarly, the ground terminal 124 is arranged between the Y capacitor 214 and the Y capacitor 224. In this embodiment, a configuration is described in which two Y capacitors are connected on the same AC line, but three or more Y capacitors may be connected. For example, a third noise filter, a fourth noise filter . . . may be connected. In this case, a ground terminal is arranged between Y capacitors adjacent to each other on the same AC line to electrically separate the adjacent Y capacitors.

Such a configuration eliminates a common impedance between the Y capacitors 213 and 223 existing on the same AC line and connected to each other via the ground pattern 127 on the substrate 121. Therefore, change in ground potential of the Y capacitors existing on the same AC line and connected to each other via the ground pattern 127 on the substrate 121 due to suppression or absorption of noise by each other can be prevented, with the result that the effect of suppressing terminal noise by the Y capacitors can be fully exerted. The same can be said with regard to the Y capacitors 214 and 224. As described above, according to this embodiment, the effect of suppressing noise by the capacitors arranged as the noise filter can be fully exerted.

[Pattern of Substrate of Power Supply Apparatus]

Figure 5:
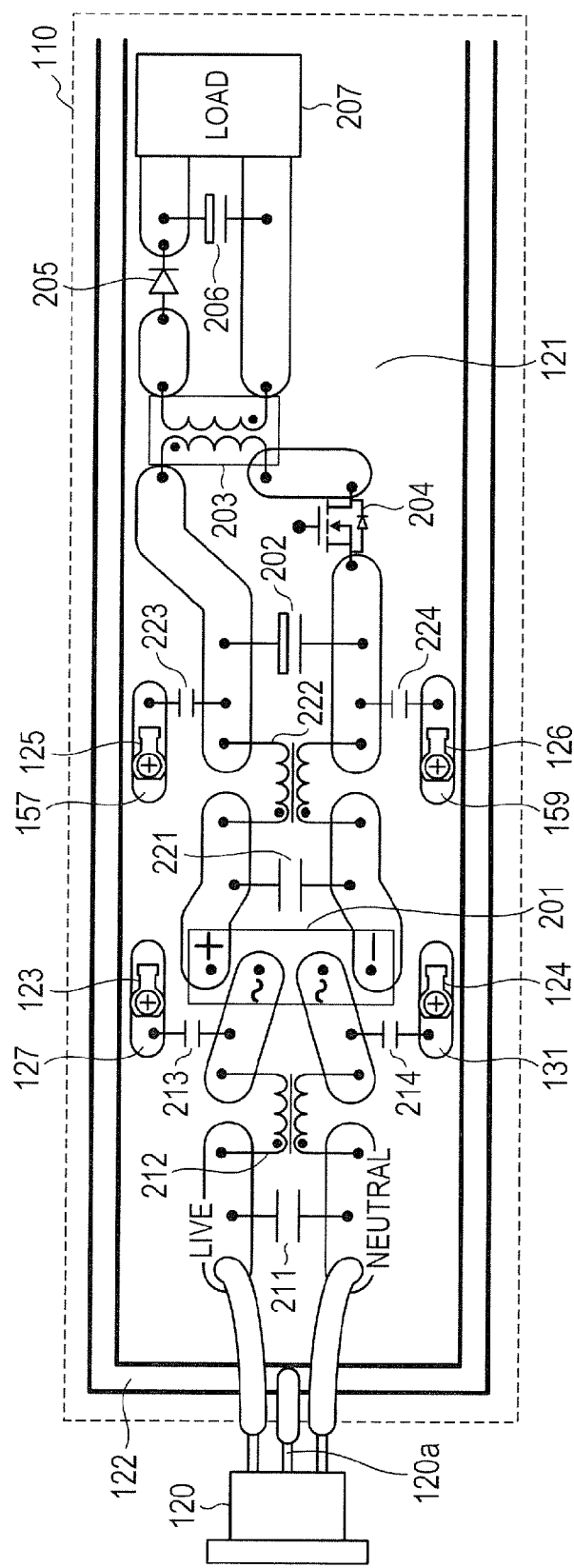
FIG. 5 is an illustration of a pattern of a substrate of a power supply apparatus according to a fourth embodiment of the present invention.

FIG. 5 is an illustration of a pattern of a substrate according to a fourth embodiment of the present invention. This embodiment is different from the configuration described in the third embodiment in the separation method for the grounds of the Y capacitors 213, 223, 214, and 224 on the substrate 121. Note that, like reference numerals are used to designate like components described in the second embodiment, and description thereof is omitted.

According to the third embodiment, the Y capacitors 213, 223, 214, and 224 are configured as follows so as not to have the common impedances 128 (see FIG. 7B), 129, and 130 (see FIG. 3). The ground patterns 127 and 131 for the respective AC lines of the Y capacitors 213, 223, 214, and 224 on the substrate 121 are electrically separated from each other. Further, according to the third embodiment, when two or more Y capacitors, for example, the Y capacitors 213 and 223, exist on the same AC line, the ground terminal 123 is arranged between the Y capacitor 213 and the Y capacitor 223. Such a configuration eliminates a common impedance between Y capacitors.

According to this embodiment, for the Y capacitor 213, the ground terminal 123 serving as the first connecting member is arranged in the ground pattern 127 to which the Y capacitor 213 is connected. For the Y capacitor 223, a ground terminal 125 serving as a third connecting member is arranged in a ground pattern 157 to which the Y capacitor 223 is connected. For the Y capacitor 214, the ground terminal 124 serving as the second connecting member is arranged in the ground pattern 131 to which the Y capacitor 214 is connected. For the Y capacitor 224, a ground terminal 126 serving as a fourth connecting member is arranged in a ground pattern 159 to which the Y capacitor 224 is connected. In other words, this embodiment has a configuration in which ground terminals corresponding to the plurality of Y capacitors, respectively, are arranged independently. As described above, by forming the ground terminals 123, 125, 124, and 126 for the Y capacitors 213, 223, 214, and 224, respectively, the ground patterns on the substrate 121 are separated from one another with reliability. Then, change in ground potential of the Y capacitors due to suppression or absorption of noise by one another can be further prevented, and the effect of suppressing terminal noise can be fully exerted. As described above, according to this embodiment, the effect of suppressing noise by the capacitors arranged as the noise filter can be fully exerted.

The power supply apparatus described in the first to fourth embodiments are applicable as, for example, a low voltage power supply for an image forming apparatus, that is, a power supply configured to supply power to a controller (control unit) or a driving unit, e.g., a motor. A configuration of an image forming apparatus to which the power supply apparatus according to the first to fourth embodiments are applied is described below.

[Configuration of Image Forming Apparatus]

Figure 6:
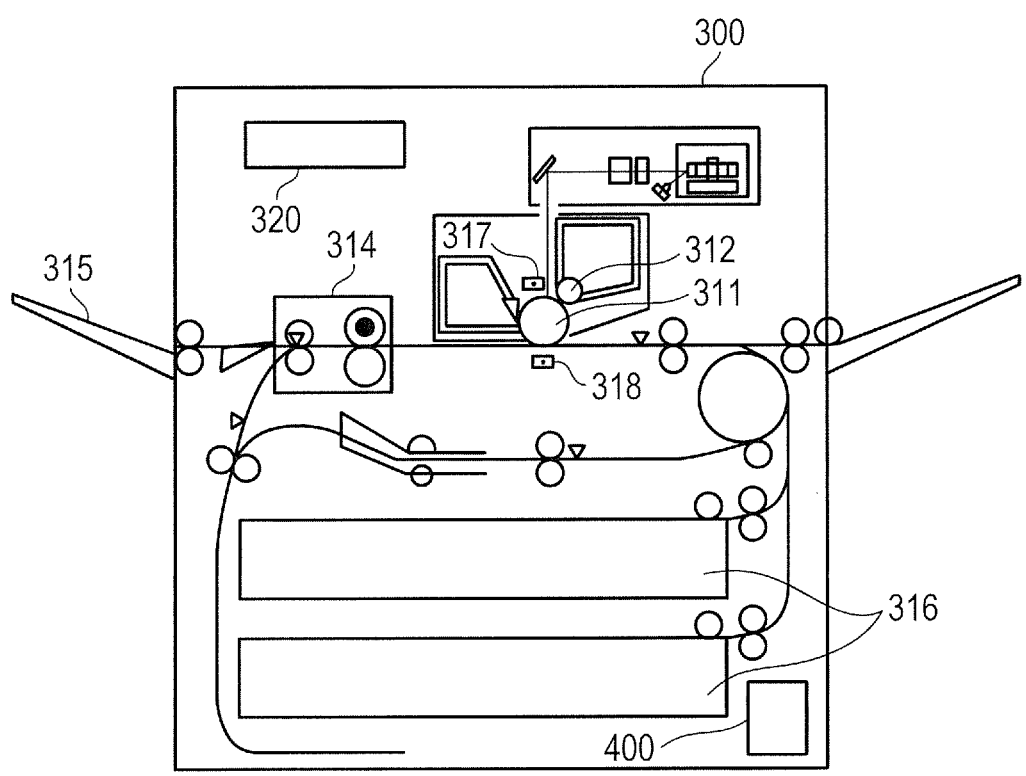
FIG. 6 is an illustration of a configuration of an image forming apparatus according to a fifth embodiment of the present invention.

A laser beam printer is described as an example of the image forming apparatus. FIG. 6 is an illustration of a schematic configuration of a laser beam printer as an example of an electrophotographic printer. A laser beam printer 300 includes a photosensitive drum 311 serving as an image bearing member on which an electrostatic latent image is formed, a charging unit 317 (charging device) configured to uniformly charge the photosensitive drum 311, and a developing unit 312 (developing device) configured to develop, with toner, the electrostatic latent image formed on the photosensitive drum 311. The toner image developed on the photosensitive drum 311 is transferred by a transfer unit 318 (transfer device) onto a sheet (not shown) serving as a recording material, which is supplied from a cassette 316, and the toner image transferred onto the sheet is fixed by a fuser 314. Then, the sheet is discharged to a tray 315. The photosensitive drum 311, the charging unit 317, the developing unit 312, and the transfer unit 318 form an image forming unit. Further, the laser beam printer 300 includes a power supply apparatus 400 described in the first to fourth embodiments. An image forming apparatus to which the power supply apparatus 400 according to the first to fourth embodiments are applicable is not limited to the one illustrated in FIG. 6, and, for example, may be an image forming apparatus including a plurality of image forming units. Further, the image forming apparatus may be an image forming apparatus including a primary transfer unit configured to transfer, onto an intermediate transfer belt, a toner image on the photosensitive drum 311 and a secondary transfer unit configured to transfer, onto a sheet, the toner image on the intermediate transfer belt.

The laser beam printer 300 includes a controller 320 configured to control image forming operation by the image forming unit and sheet conveying operation. The power supply apparatus 400 described in the first to fourth embodiments supplies power to, for example, the controller 320. Further, the power supply apparatus 400 described in the first to fourth embodiments supplies power to the driving unit, e.g., a motor configured to rotate the photosensitive drum 311 or configured to drive various kinds of rollers for conveying the sheet and the like. In other words, the load 207 in the first to fourth embodiments corresponds to the controller 320 or the driving unit.

In the power supply apparatus 400 of the image forming apparatus according to this embodiment, with regard to Y capacitors forming a noise filter, a Y capacitor connected to a live side of an AC line and a Y capacitor connected to a neutral side of the AC line are electrically separated. Further, in the power supply apparatus of the third and fourth embodiments in which two or more Y capacitors are connected to an AC line, Y capacitors adjacent to each other are electrically separated. Specifically, in the power supply apparatus according to the third embodiment, a ground terminal is arranged between adjacent Y capacitors. Further, in the power supply apparatus according to the fourth embodiment, ground terminals are formed for a plurality of Y capacitors, respectively. In this way, even when two or more Y capacitors are connected to the same AC line, the Y capacitors are electrically separated from each other. This can prevent change in ground potential of the Y capacitors due to suppression or absorption of noise by each other, with the result that the effect of suppressing terminal noise of the Y capacitors can be fully exerted. As described above, according to this embodiment, the effect of suppressing noise by the capacitors arranged as a noise filter can be fully exerted.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent configurations and functions.

This application claims the benefit of Japanese Patent Application No. 2015-112301, filed Jun. 2, 2015, which is hereby incorporated by reference herein in its entirety.

What is claimed is:

1. A power supply apparatus, comprising:
a first capacitor including at least one capacitor whose one end is connected to a live side of an AC line of an AC voltage supplied from an AC power supply;
a second capacitor including at least one capacitor whose one end is connected to a neutral side of the AC line;
at least one first ground pattern to which another end of the first capacitor is connected;
at least one second ground pattern to which another end of the second capacitor is connected; and
a substrate on which the first capacitor and the second capacitor are mounted, and the at least one first ground pattern and the at least one second ground pattern are formed,
wherein the at least one first ground pattern and the at least one second ground pattern are not connected electrically on the substrate.

2. A power supply apparatus according to claim 1, further comprising:
a frame ground to which a ground of the AC power supply is connected;
at least one first connecting member configured to connect the at least one first ground pattern to the frame ground; and
at least one second connecting member configured to connect the at least one second ground pattern to the frame ground.

3. A power supply apparatus according to claim 2, further comprising:
a diode bridge configured to rectify the AC voltage that is input from the AC power supply;
a smoothing capacitor configured to smooth the AC voltage rectified by the diode bridge;
a third capacitor including at least one capacitor whose one end is connected to a positive terminal line of the smoothing capacitor;
a fourth capacitor including at least one capacitor whose one end is connected to a negative terminal line of the smoothing capacitor;
at least one third ground pattern to which another end of the third capacitor is connected; and
at least one fourth ground pattern to which another end of the fourth capacitor is connected,
wherein the at least one third ground pattern and the at least one fourth ground pattern are not connected electrically on the substrate.

4. A power supply apparatus according to claim 3,
wherein the at least one first ground pattern and the at least one third ground pattern are connected electrically on the substrate, and
wherein the at least one second ground pattern and the at least one fourth ground pattern are connected electrically on the substrate.

5. A power supply apparatus according to claim 3,
wherein the at least one third ground pattern is connected to the frame ground by the at least one first connecting member, and
wherein the at least one fourth ground pattern is connected to the frame ground by the at least one second connecting member.

6. A power supply apparatus according to claim 3,
wherein the at least one first ground pattern and the at least one fourth ground pattern are connected electrically on the substrate, and
wherein the at least one second ground pattern and the at least one third ground pattern are connected electrically on the substrate.

7. A power supply apparatus according to claim 3,
wherein the at least one third ground pattern is connected to the frame ground by the at least one second connecting member, and
wherein the at least one fourth ground pattern is connected to the frame ground by the at least one first connecting member.

8. A power supply apparatus according to claim 3,
wherein at least one of the first capacitor, the second capacitor, the third capacitor, and the fourth capacitor includes two or more capacitors, and
wherein another ends of the two or more capacitors are connected to a ground pattern on the substrate.

9. A power supply apparatus according to claim 8,
wherein at least one of the first capacitor, the second capacitor, the third capacitor, and the fourth capacitor includes two or more capacitors, and
wherein the connecting member configured to connect the ground pattern to which the at least one capacitor including the two or more capacitors to the frame ground is arranged between an adjacent pair of capacitors among the two or more capacitors.

10. A power supply apparatus according to claim 3, wherein the at least one first ground pattern, the at least one second ground pattern, the at least one third ground pattern, and the at least one fourth ground pattern are formed independently from one another and are disconnected from one another on the substrate.

11. A power supply apparatus according to claim 10, further comprising:
   at least one third connecting member configured to connect the at least one third ground pattern to the frame ground; and
   at least one fourth connecting member configured to connect the at least one fourth ground pattern to the frame ground.

12. A power supply apparatus according to claim 1, wherein the at least one capacitor comprises a ceramic capacitor.

13. An image forming apparatus, comprising:
   an image forming device configured to form an image on a recording material; and
   a power supply apparatus,
   the power supply apparatus comprising:
      a first capacitor including at least one capacitor whose one end is connected to a live side of an AC line of an AC voltage supplied from an AC power supply;
      a second capacitor including at least one capacitor whose one end is connected to a neutral side of the AC line;
      at least one first ground pattern to which another end of the first capacitor is connected;
      at least one second ground pattern to which another end of the second capacitor is connected; and
      a substrate on which the first capacitor and the second capacitor are mounted, and the at least one first ground pattern and the at least one second ground pattern are formed,
      the at least one first ground pattern and the at least one second ground pattern being prevented from being connected electrically on the substrate.

14. A noise filter, comprising:
   a first capacitor that is mounted on a substrate, and includes one end connected to a live side of an AC line of an AC voltage supplied from an AC power supply;
   a second capacitor including one end connected to a neutral side of the AC line;
   a first ground pattern to which another end of the first capacitor is connected; and
   a second ground pattern to which another end of the second capacitor is connected,
   wherein the first ground pattern is electrically separated from the second ground pattern on the substrate.

* * * * *